Oct. 21, 1969 P. P. CASTRUCCI ET AL 3,473,976

CARRIER LIFETIME KILLER DOPING PROCESS FOR SEMICONDUCTOR STRUCTURES AND THE PRODUCT FORMED THEREBY

Filed March 31, 1966

FIG. 1G

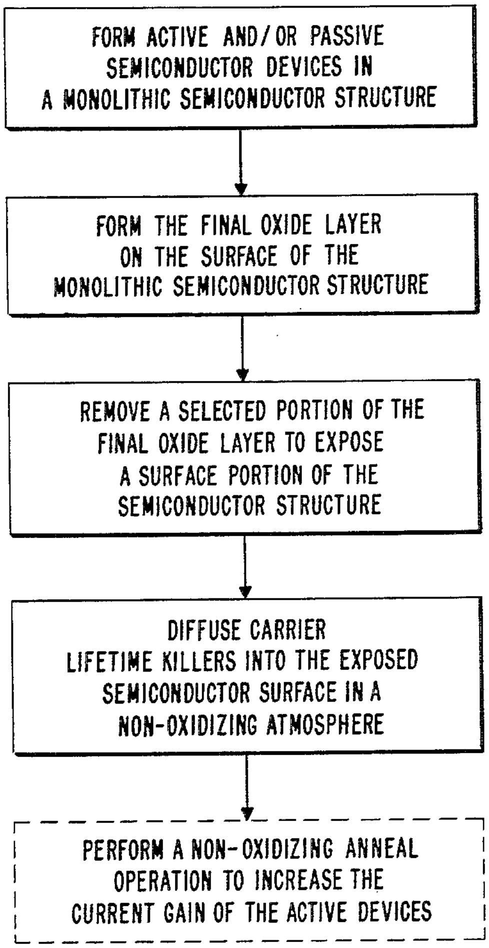

FIG. 3G

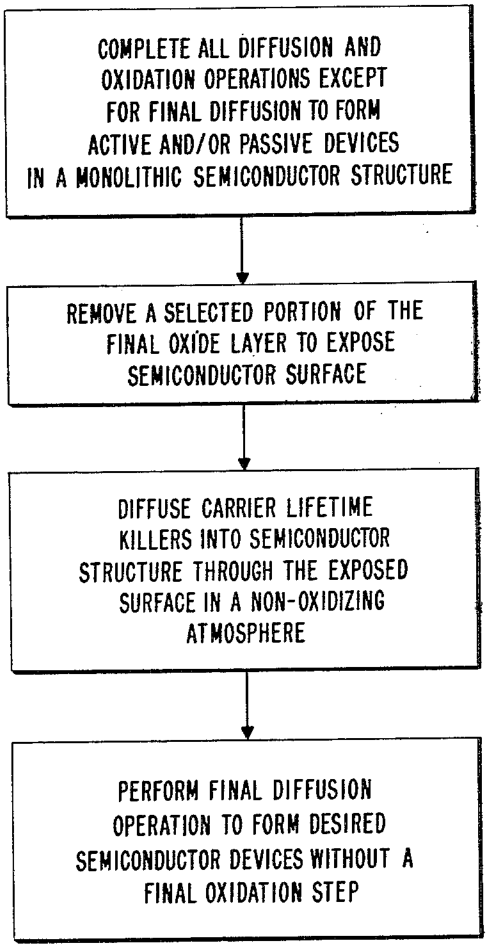

TOTAL CARRIER LIFETIME KILLER DIFFUSION TIME (INCLUDING FURNACE RECOVERY TIME)

| TEMP \ TIME | 5 (MIN) | 20 (MIN) | 30 (MIN) | 60 (MIN) |
|---|---|---|---|---|
| 970°C | — | 50 $\beta$ 16-17 $\tau$ | 40-50 $\beta$ 10-11 $\tau$ | 15-17 $\beta$ 8.5-9 $\tau$ |
| 1000°C | — | 30-40 $\beta$ 7.5-8 $\tau$ | — | — |
| 1025°C | 25-35 $\beta$ 6-6.5 $\tau$ | 15-25 $\beta$ 4.0 $\tau$ | — | — |

FIG. 2G

INVENTORS
PAUL P. CASTRUCCI
MARTIN S. HESS
RAYMOND P. PECORARO

BY Harry M Weiss
ATTORNEY

United States Patent Office 3,473,976
Patented Oct. 21, 1969

3,473,976

CARRIER LIFETIME KILLER DOPING PROCESS FOR SEMICONDUCTOR STRUCTURES AND THE PRODUCT FORMED THEREBY

Paul P. Castrucci, Martin S. Hess, and Raymond P. Pecoraro, Poughkeepsie, N.Y., assignors to International Business Machines Corporation, Armonk, N.Y., a corporation of New York Filed Mar. 31, 1966, Ser. No. 539,007
Int. Cl. H01l 7/36
U.S. Cl. 148—175 14 Claims

ABSTRACT OF THE DISCLOSURE

A method of gold doping of semiconductor structures to reduce carrier lifetime without attendant "pipe" formation. In semiconductor structures utilizing oxide layers, the gold diffusion step is carried out subsequent to the formation of the final oxide layer. The gold diffusion is performed in a nonoxidizing atmosphere.

This invention is directed generally to an improved carrier lifetime killer doping process for semiconductor structures and the product formed thereby and, more particularly, to an improved gold doping process for monolithic semiconductor structures which performs the double function of reducing carrier lifetime and eliminating the formation of "pipes" or electrical shorts in the monolithic structures.

Recent trends in the semiconductor art have been in the direction of miniaturization of semiconductor device structures to achieve higher operating speeds, lower cost of fabrication, and greater component reliability. Some of these miniature semiconductor devices are integrated by fabricating the devices in a single substrate of the same material as the semiconductor devices. Other integrated fabrication techniques form a number of integrated semiconductor devices on a support structure or substrate of any desired material. These fabrication techniques are being extensively developed in order to permit the utilization of semiconductor device components into large and complex electronic equipment, such as computers for higher speed operation. However, the most essential factor in the production of monolithic integrated semiconductor structures is to have a high manufacturing yield and therefore, a low cost fabrication process.

In the past, it was well known in the semiconductor manufacturing art to dope semiconductor structures with carrier lifetime killers such as gold, platinum, etc. in order to reduce carrier lifetime. These carrier lifetime killing impurities formed recombination regions in the semiconductor body thereby decreasing the lifetimes of the carriers to permit either fast transistor switching operations or quick turn off. However, it was discovered that in applying the use of carrier lifetime killers channels or "pipes" were somehow formed between regions of the same conductivity type such as between the diffused emitter and the collector regions of a transistor thereby shorting out these two regions and destroying the operation of the transistor device. In the fabrication of a great multiplicity of discrete or individual transistor devices in a single semiconductor wafer (i.e. 1100 devices in a wafer), it was not essential that this "pipe" formation phenomena be controlled due to the fact that if some of the devices were inoperable because of the formation of "pipes" there were still a sufficient number of discrete devices available for use and the resultant loss in yield, though significant, did not become critical.

However, in the formation of monolithic integrated semiconductor structures wherein a multiplicity of active (transistors, diodes, etc.) and passive (resistors, capacitors, etc.) devices were fabricated in a single monocrystalline semiconductor body and interconnected to form individual chips having as many as 144 components, it became extremely critical to control the formation of "pipes" since a single shorting "pipe" formed in a densely populated integrated chip structure would destroy not only the operation of the individual device where the pipe was formed but, in addition, would destroy or render inoperative the entire monolithic structure. The yield in producing monolithic integrated structures without solution of this "pipe" problem was approximately zero percent.

Most of the previous gold diffusion operations in the fabrication of discrete or monolithic silicon semiconductor structures usually took place either prior to the emitter type diffusion or right after the emitter type diffusion, but prior to the final oxidation step in the semiconductor manufacturing or fabrication process. The formation of discrete or monolithic semiconductor structures using the teachings of these prior art carrier lifetime killer diffusion techniques did perform a carrier lifetime killing function, however, it was discovered that shorting "pipes" were somehow also formed causing a substantially zero percent yield for densely populated monolithic semiconductor structures.

Accordingly, it is an object of this invention to provide a method for reducing "pipe" formation in semiconductor structures doped with carrier lifetime killers.

It is another object of this invention to provide a method for reducing "pipe" formation in monolithic integrated semiconductor structures doped with carrier lifetime killers.

It is a further object of this invention to provide a method for introducing carrier lifetime killers into a monolithic integrated structure and reducing "pipe" formations therein.

It is a still further object of this invention to provide an improved semiconductor structure doped with carrier lifetime killers.

It is still another object of this invention to provide an improved monolithic integrated semiconductor structure doped with carrier lifetime killers.

According to one aspect of this invention, a method for the reduction carried lifetime in a semiconductor structure and preventing the formation of shorting "pipes" therein comprises the step of injecting carrier lifetime killers into the semiconductor structure in a non-oxidizing atmosphere after a final oxide layer is formed on a surface of the semiconductor structure. Preferably, the semiconductor structure is a monocrystalline body of silicon, the carrier lifetime killer is gold, and the non-oxidizing atmosphere is nitrogen.

The foregoing and other objects, features and advantages of the invention will be apparent from the following more particular description of a preferred embodiment of the invention as illustrated in the accompanying drawings.

In the drawings:

FIG. 1G is a flow diagram of the fabrication steps of a monolithic integrated structure in accordance with one embodiment of this invention;

FIG. 2G is a table showing the transistor current gain $\beta$ and the carrier lifetime $\tau$ (in nanoseconds) dependent on the time and temperature of the carrier lifetime killer diffusion cycle and the anneal operation in the embodiment of FIG. 1G; and FIG. 3G is a flow diagram of another embodiment of the method of this invention.

In discussing the semiconductor fabrication method, the usual terminology that is well known in the transistor field will be used. In discussing concentrations, references will be made to majority of minority carriers. By "carriers" is signified the free-holes or electrons which are responsible for the passage of current through a semiconductor material. Majority carriers are used in reference to those carriers in the material under discussion, i.e. holes in P type material or electrons in N type material. By use of the terminology "minority carriers" it is intended to signify those carriers in the minority, i.e. holes in N type material or electrons in P type material. In the most common type of semiconductor materials used in present day transistor structure, carrier concentration is generally due to the concentration of the "significant impurity," that is, impurities which impart conductivity characteristics to extrinsic semiconductor materials.

Although for the purpose of describing this invention reference is made to a semiconductor configuration wherein a $P^-$ type region is utilized as the substrate and subsequent semiconductor regions of the composite semiconductor structure are formed in the conductivity types described, it is readily apparent that the same regions that are referred to as being of one conductivity type can be of the opposite type conductivity and furthermore, some of the operations which are described as diffusion operations can be made by epitaxial growth and some of the epitaxial growth regions can also be fabricated by diffusion techniques.

The gold doping process of this invention is particularly useful in fabricating the monolithic integrated structure described in the patent application entitled "Monolithic Integrated Structure "Including Fabrication and Package Therefor" assigned to the same assignee of this invention and filed concurrently herewith.

In accordance with the method depicted in the flow diagram of FIG. 1G, one detail specific example is described below of the fabrication of a monolithic integrated structure.

A wafer of $P^-$ type conductivity, preferably having a resistivity of 10 to 20 ohms-centimeter is used as the starting material. The wafer is preferably a monocrystalline silicon structure which can be fabricated by conventional techniques such as by pulling a silicon semiconductor member from a melt containing the desired impurity concentration and then slicing the pulled member into a plurality of wafers. The wafers are cut, lapped and chemically polished to 7.9 ($\mp$.8) mils in thickness. The wafers are oriented 4°($\mp$0.5°) off the (111) axis towards the (110) direction.

An initial oxide layer or coating preferably of silicon dioxide and having a thickness of 5200 angstrom units is thermally grown by conventional heating in a dry $O_2$ atmosphere for 10 minutes followed by heating in a wet or steam atmosphere at 1050° C. for 60 minutes. If desired, the oxide layer can be formed by pyrolytic deposition or by an RF sputtering technique, as described in a patent application identified as Ser. No. 428,733, filed Jan. 28, 1965, in the names of Davidse and Maissel and assigned to the same assignee as this invention.

By standard photolithographic masking and etching techniques a photoresist layer is deposited onto the wafer including the surface of the initial oxide layer formed thereon and by using the photoresist layer as a mask surface regions are exposed on the surface of the wafer by etching away the desired portions of the $SiO_2$ layer with a buffered HF solution. The photoresist layer is then removed to permit further processing.

A diffusion operation is carried out to diffuse into the exposed surface portions of the wafer N type impurities to form $N^+$ regions in the wafer having a $C_o$ of $2\times10^{20}$ cm.$^{-3}$ of N type majority carriers. The initial oxide layer serves as a mask to prevent an $N^+$ region from being formed across the entire surface of the wafer. Preferably, the diffusion operation is carried out in an evacuated quartz capsule using degenerate arsenic doped silicon powder. As an alternative variation, the $N^+$ regions can be formed by etching out a channel in the $P^-$ type wafer and then subsequently epitaxially growing $N^+$ regions.

After removing the entire initial oxide layer with a buffered HF solution, a region of N type conductivity, preferably having a resistivity of about 0.2 ohm per centimeter, is epitaxially grown on the surface of the wafer. The N type epitaxial region is an arsenic doped layer approximately 5.5 to 6.5 microns thick. In actual device fabrication, the arsenic impurities in the $N^+$ regions, which are now buried, outdiffuse about one micron during the epitaxial deposition.

A second oxide layer approximately 5200 angstrom units thick is formed on the surface of the epitaxially grown region either by the same thermal oxidation process, by pyrolytic deposition, or by RF sputtering techniques.

A number of openings are formed in specific areas of the oxide layer by standard photolithographic masking and etching techniques using a photoresist layer as a mask and a buffered HF solution for etching away the oxide portions. The structure is now prepared for a second diffusion operation which is for isolation of the active and passive devices to be formed and, if desired, to form underpass connectors such as the one described in the patent application entitled "Low Resistivity Semiconductor Underpass Connector and Fabrication Method Therefor" assigned to the same assignee of this invention and filed concurrently herewith.

A P type diffusion step is carried out, preferably using a boron source, to form $P^+$ regions in the N type epitaxially grown layer. This diffusion operation is carried out at a temperature of 1200° C. for a period of 95 minutes forming a $C_o$ (surface concentration) of $5\times10^{20}$ cm.$^{-3}$. It is evident that the $P^+$ diffused regions will each have a low resistivity surface region which extends downwardly from the surface of the semiconductor structure. In forming isolation diffusions, the diffused $P^+$ type regions reach and become continuous with the original substrate or $P^-$ starting material.

A third oxide layer is formed after the isolation diffusion operation. The third oxide layer is preferably 4300 angstrom units thick and can be formed by a thermal oxidation process such as by heating at 1050° C. for a period of 5 minutes in dry $O_2$ following by 15 minutes in steam and 5 minutes in dry $O_2$.

A photoresist coating is applied to the surface of the third oxide layer and by photolithographic masking and etching techniques desired portions of the $SiO_2$ layer are removed using a buffered HF solution.

A base or resistor diffusion is now carried out preferably using boron as the impurity source. This diffusion operation is for 70 minutes at 1075° C. and forms P type regions having an impurity surface concentration $5\times10^{19}$ cm.$^{-3}$.

The base or resistor diffusion step is followed by a reoxidation drive-in operation. A fourth layer of $SiO_2$ is grown having a thickness of about 3600 angstrom units on the base and/or resistor regions. During this heat treatment, the boron impurities are redistributed thereby increasing the junction depth and lowering the $C_o$. The oxidation drive-in cycle is 25 minutes in dry $O_2$ and 10 minutes in steam followed by 15 minutes in dry $O_2$ at 1150° C.

In forming transistor devices, a photoresist coating is applied over the fourth oxide layer and by photolithographic masking and etching operations portions of this oxide layer are removed over the diffused base regions to permit emitter regions to be formed by a diffusion operation.

The N type emitter regions are formed in the P type base regions using preferably a phosphorous impurity source such as $POCl_3$ and heating the wafer in an atmosphere containing 700 p.p.m. of $POCl_3$ at a temperature of 970° C. and for a period of 35 minutes. Preferably, the emitter and base regions are formed over the buried $N^+$ region to permit this region to act as a low resistivity subcollector.

Now, a final oxidation and emitter drive-in operation is formed using a 5 minute dry $O_2$, 55 minute steam cycle followed by dry $O_2$ heat treatment (depending on the depth of the collector) at 970° C. During this heat treatment operation, the final oxide layer is formed on the semiconductor surface. It is at this critical period in the process that the carrier lifetime killer injection step is performed.

The carrier lifetime killers are injected into the wafer through an opening in the oxide preferably in the backside of the wafer. Preferably, a layer of 200 angstrom units of gold is evaporated on the wafer and the gold is diffused into the monolithic semiconductor structure by a heating operation of 20 minutes at 1000° C. in a non-oxidizing atmosphere such as nitrogen. This gold diffusion operation is followed by an anneal cycle of 2 hours at 560° C. in a non-oxidizing atmosphere such as nitrogen which also serves to increase the transistor current gain or $\beta$.

With reference to FIG. 2G, a table is shown relating temperature to the total carrier lifetime killer diffusion time (in minutes), which includes the furnace recovery time due to the fact that the furnace takes time to heat up to its original temperature after the relatively cold wafer or wafers are inserted therein. This table indicates the $\beta$ (transistor current gain) and the $\tau$ (lifetime of carriers—in nanoseconds) for certain temperature and furnace times. The $\beta$ and $\tau$ values shown are the measured values following the anneal cycle described above. For the transistor device for the monolithic structure described in the above referred to application entitled "Monolithic Integrated Structure Including Fabrication and Package Therefor" a $\beta$ of greater than 20 and a $\tau$ of less than 10 nanoseconds is desired. Hence, the optimum furnace time and temperature combination is the carrier lifetime killer diffusion time of 20 minutes at 1000° C. since this provides a value of a $\beta$ of between 30 and 40 and a $\tau$ of between 7.5 to 8 nanoseconds. A marginal value of $\beta$ and $\tau$ is the 20 minute period heat treatment at 1025° C. Although the 5 minute heat treatment period at 1025° C. appears to provide satisfactory $\beta$ and $\tau$ values, this period is less desirable due to the fact that the furnace recovery time is approximately 8 minutes which means that consistent $\beta$ and $\tau$ values are difficult to achieve from wafer to wafer since the furnace has not reached the desired temperature level. Hence, in withdrawing some of the wafers from the furnace a few seconds away from time other wafers are removed from the furnace, after the 5 minute diffusion cycle at 1025° C., the $\beta$ and $\tau$ values will be different for those wafers withdrawn from the furnace at the slightly different time periods.

Referring to FIG. 3G, another embodiment in accordance with the method of this invention of doping monolithic structures with carrier lifetime killers is shown in block flow diagram form. In this embodiment, all diffusions and oxidation steps are carried out for example, as described above, except for the final emitter type diffusion step, which in most cases is for either creating the emitter or N+ type region in the diffused base region for forming transistor devices or this diffusion operation can be carried out to form a passive device such as a low resistance resistor.

A selected portion of the final oxide layer formed on the wafer surface after the base type diffusion is removed to permit the gold diffusion operation described above. This gold or carrier lifetime killer diffusion operation is carried out in a non-oxidizing atmosphere such as nitrogen or possibly argon.

Finally, the emitter type diffusion operation is carried out, however, this is not followed by an oxidation step and drive-in of the emitter diffused impurities can be achieved in a non-oxidizing atmosphere. This alternate embodiment does not require an anneal cycle since the emitter type diffusion follows the injection of carrier lifetime killers in the wafer. Furthermore, higher gold diffusion temperatures can be used which would reduce the carrier lifetimes since the emitter diffusion follows the gold diffusion step. Hence, the gold diffusion step does not degrade circuit performance or damage the structure of the semiconductor device.

Electrical contacts are made to the desired semiconductor regions by conventional means such as by applying evaporated aluminum onto the desired areas for good ohmic contact. The various semiconductor devices formed in the monolithic structure are integrated or interconnected, as desired, by standard interconnection techniques.

Although it is not clearly understood at this time how the formation of shorting "pipes" is controlled by the above described process, it is believed that heat treatments, following the carrier lifetime killer injection, performed in a non-oxidizing atmosphere provides a solution to the shorting "pipe" problem.

This "pipe" formation control method is applicable to the fabrication of discrete or individual devices as well as monolithic integrated structures.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for reducing carrier lifetime and preventing the formation of shorting pipes in a semiconductor structure with a plurality of PN junctions therein and having thereon a final oxide layer with at least one opening therein comprising the step of injecting carrier lifetime killers into said semiconductor structure in a non-oxidizing atmosphere through said opening.

2. A method for reducing carrier lifetime in a semiconductor structure and preventing the formation of shorting pipes therein in accordance with claim 1, wherein said semiconductor structure is a monocrystalline body of silicon, said carrier lifetime killer being gold, and said non-oxidizing atmosphere being nitrogen.

3. A method for reducing carrier lifetime in a semiconductor structure and preventing the formation of shorting pipes therein in accordance with claim 1, wherein said carrier lifetime killer injection step follows the final diffusion operation required to form a semiconductor device in said semiconductor structure, and heating in a non-oxidizing atmosphere for a period of time and at a temperature sufficient to anneal the structure and to increase the current gain of the semiconductor device.

4. A method for reducing carrier lifetime in a semiconductor structure and preventing the formation of shorting pipes therein in accordance with claim 1, wherein said carrier lifetime killer injection step precedes the final diffusion operation required to form a semiconductor device in said semiconductor structure.

5. The method of claim 1 wherein said semiconductor structure is a planar device.

6. The semiconductor structure formed in accordance with the method of claim 1.

7. A method for reducing carrier lifetime and preventing the formation of shorting pipes in a monolithic semiconductor structure with a plurality of active and passive semiconductor devices therein and having thereon a final oxide layer with at least one opening therein comprising the step of diffusing carrier lifetime killers into said semiconductor structure in a non-oxidizing atmosphere through said opening.

8. A method for reducing carrier lifetime in a monolithic semiconductor structure and preventing the formation of shorting pipes therein in accordance with claim 1, wherein said monolithic semiconductor structurt is a monocrystalline body of silicon, said carrier lifetime killer being gold, and said non-oxidizing atmosphere being nitrogen.

9. A method for reducing carrier lifetime in a monolithic semiconductor structure and preventing the formation of shorting pipes therein, in accordance with claim 1, wherein said carrier lifetime killer injection step follows the final diffusion operation required to form said active semiconductor devices in said semiconductor structure, and heating in a non-oxidizing atmosphere for a period of time and at a temperature sufficient to anneal the structure and to increase the current gain of the active semiconductor devices.

10. A method for reducing carrier lifetime in a monolithic semiconductor structure and preventing the formation of shorting pipes therein in accordance with claim 1, wherein said carrier lifetime killer injection step precedes the final diffusion operation required to form said active semiconductor device in said semiconductor structure.

11. The monolithic semiconductor structure formed in accordance with the method of claim 1.

12. The method of claim 7 wherein at least one of the active devices has at least two PN junctions.

13. The method of claim 7 wherein said monolithic semiconductor structure is planar.

14. A method for reducing carrier lifetime in a monolithic semiconductor structure and preventing the formation of shorting pipes therein comprising the steps of:

forming a plurality of regions of a high concentration of one type conductivity in a substrate of the opposite conductivity type;

epitaxially growing a layer of said one type conductivity on said substrate layer and on said regions having a high concentration of said one type conductivity;

isolating regions of said epitaxially grown layer by diffusing a network of connecting regions of said opposite type conductivity into said epitaxially grown layer, said isolating regions being in contact with said substrate region;

forming active and passive devices in isolated regions of said epitaxially grown layer;

forming a final oxide layer on the surface of the monolithic semiconductor structure;

removing a selected portion of the final oxide layer to expose a surface portion of the monolithic semiconductor structure;

depositing a layer of gold on the monolithic semiconductor surface in contact with the exposed surface portion thereof;

diffusing the gold into the exposed monolithic semiconductor surface by heating the structure in a nonoxidizing atmosphere at a temperature of 1000° C. for a period of about 20 minutes; and annealing the monolithic semiconductor structure by heat treating in a nonoxidizing atmosphere for a period of 2 hours at a temperature of 560° C. to also increase the transistor current gain of the active devices.

References Cited

UNITED STATES PATENTS

| | | | |
|---|---|---|---|
| 2,790,940 | 4/1957 | Prince. | |
| 3,067,485 | 12/1962 | Ciccolella et al. | 148—186 X |
| 3,100,166 | 8/1963 | Marinace et al. | 148—188 X |
| 3,132,408 | 5/1964 | Pell | 148—188 X |
| 3,342,651 | 9/1967 | Raithel | 148—188 |
| 3,356,543 | 12/1967 | Desmond et al. | 148—188 X |
| 3,380,153 | 4/1968 | Husher et al. | 148—175 X |

L. DEWAYNE RUTLEDGE, Primary Examiner

R. A. LESTER, Assistant Examiner

U.S. Cl. X.R.

29—578; 148—1.5, 186, 187, 188